United States Patent [19]

Henningsen et al.

[11] 4,342,908
[45] Aug. 3, 1982

[54] LIGHT DISTRIBUTION SYSTEM FOR OPTICAL ENCODERS

[75] Inventors: Tom Henningsen, Monroeville; Forrest E. Coyle, Penn Hills, both of Pa.; Roger D. Moates, Raleigh, N.C.

[73] Assignee: Westinghouse Electric Corp., Pittsburgh, Pa.

[21] Appl. No.: 182,300

[22] Filed: Aug. 28, 1980

[51] Int. Cl.³ .............................................. G02B 5/14
[52] U.S. Cl. ............................ 250/227; 250/231 SE
[58] Field of Search ............ 250/227, 231 R, 231 SE, 250/231 GY, 229; 350/96.1, 96.15; 340/347 P

[56] References Cited

U.S. PATENT DOCUMENTS

| | | | |
|---|---|---|---|
| 3,244,895 | 4/1966 | Anderegg | 250/231 SE |
| 3,689,160 | 9/1972 | Shimulenis et al. | 250/231 SE |
| 3,731,107 | 5/1973 | Goodwin et al. | 250/227 |
| 3,846,788 | 11/1974 | Calabro et al. | 340/347 P |
| 3,846,789 | 11/1974 | Germer et al. | 340/347 P |
| 4,037,219 | 7/1977 | Lewis | 250/231 SE |
| 4,113,353 | 9/1978 | Matsushita | 350/96.1 |
| 4,114,045 | 9/1978 | Shiina | 250/227 |
| 4,137,451 | 1/1979 | Einolf | 250/231 SE |
| 4,141,058 | 2/1979 | Mizohata et al. | 362/812 |
| 4,152,589 | 5/1979 | Mitchell | 250/237 G |

Primary Examiner—David C. Nelms
Attorney, Agent, or Firm—D. R. Lackey

[57] ABSTRACT

A light distribution system for optical encoders includes a light guide plate and a light input coupler for distributing input incident radiations into the light guide plate as a flat distributed beam of beam segments intercepted by a pattern of discrete light output couplers reflecting narrow output beams for providing a uniform pattern of encoding illuminations.

29 Claims, 10 Drawing Figures

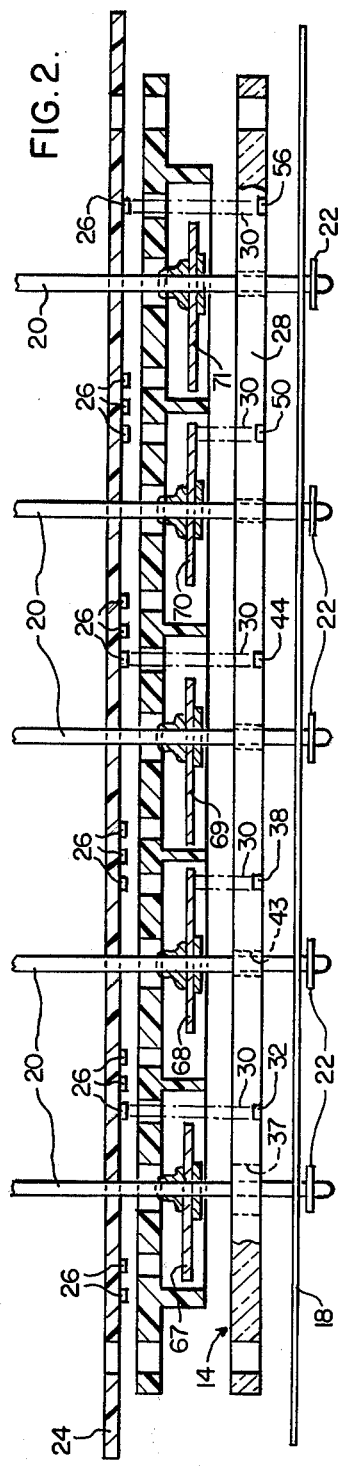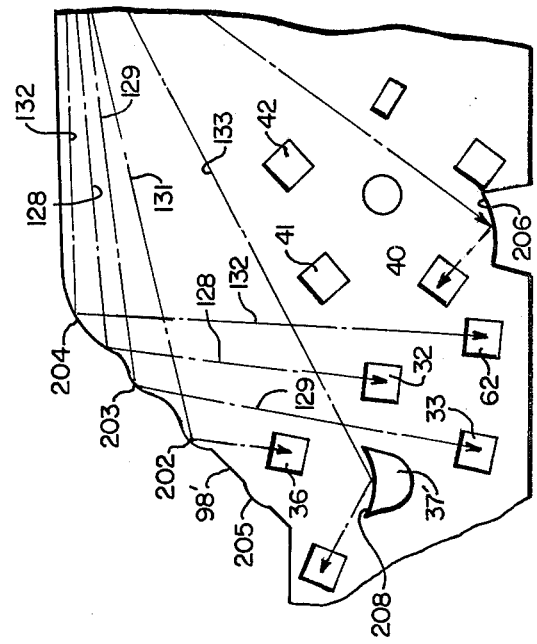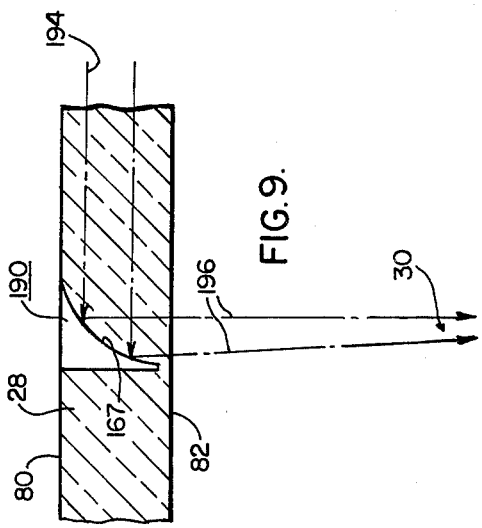

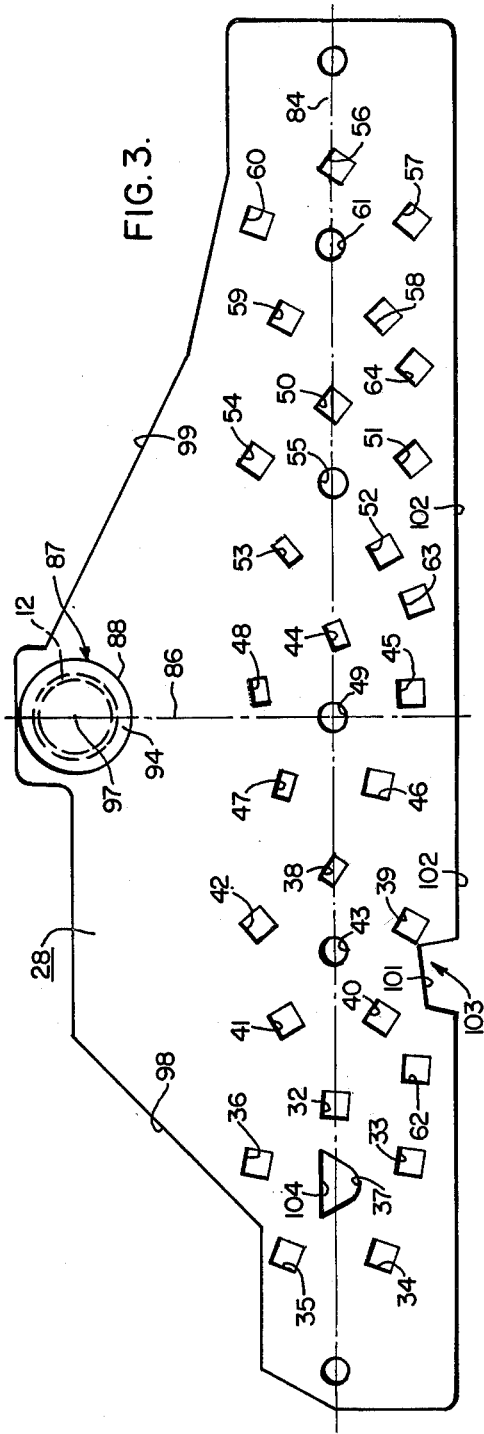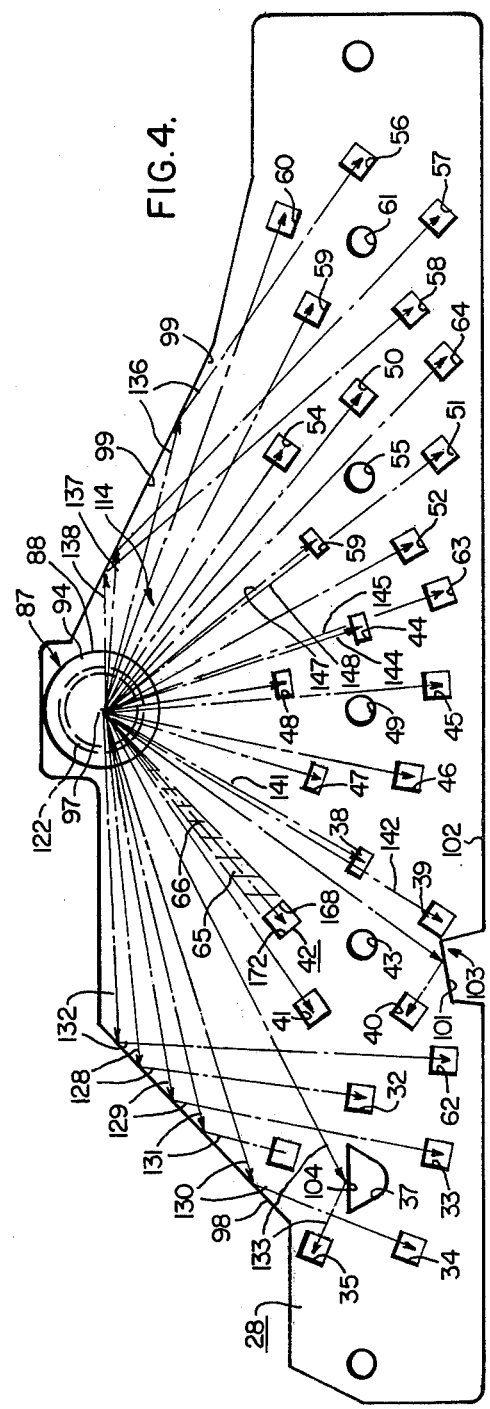

LIGHT DISTRIBUTION SYSTEM FOR OPTICAL ENCODERS

BACKGROUND OF THE INVENTION

This invention relates to optical encoders having patterns of encoding illuminations and more particularly to such optical encoders including an improved light distribution system having an efficiently arranged pattern of discrete output couplers for producing the encoding illuminations therein.

In optical encoders generally, and particularly in certain shaft angle or shaft position optical encoders, coded electrical or electronic signals are generated at photosensitive sensors in response to variations in encoding illuminations. Typically, an array of several photosensitive sensors has a predetermined pattern so that each sensor is selectively responsive to separate encoding illuminations. An associated shaft angle code pattern is usually rotated by the shaft to be monitored so that the code pattern is rotated between the sensor array and the source of the illuminations. Opaque and transparent segments of the code pattern selectively block and transmit the separate encoding illuminations to the sensors. Thus, the sensor array will provide different optically activated states correspondingly representative of the different rotated shaft positions to be encoded.

In the above type of encoder, the array of photosensitive sensors is selectively responsive to the separate encoding illuminations wherein each has a predetermined radiation level corresponding to a predetermined quantity of light energy required for effecting the desired activated response at each sensor. The source of encoding illuminations is often provided by a light distribution system including a light guide plate having discrete light output couplers for directing individual output radiation beams to separate sensors of the array. The light guide plate typically conducts a predetermined amount of radiation that is available for producing the output beams at the predetermined radiation levels. The radiations can be propagated in different light distributing modes within the light guide plate depending upon the manner in which the output beams are to exit from the output couplers. The amount of radiations and the mode in which the radiations are propagated in the light guide plate are often determined by an input coupler used to collect input radiations into the light guide plate. An electrical or electronic light source typically produces the input radiations which are incident on the input coupler. These light sources have predetermined capacities and light emitting characteristics and further have given input power ratings for corresponding light emitting intensities. Thus, the overall efficiency and operative effectiveness of a light distribution system can be characterized by comparison of the input electric power of an electrical or electronic light source and its radiant power output relative to the source radiations which are effective in being collected and conducted by the light guide plate so as to be exited in a predetermined number of output beams producing the predetermined individual radiation levels thereof.

Examples of optical encoders of the general type noted above are disclosed for encoding dial readings of utility meters in U.S. Pat. Nos. 4,037,219 issued July 19, 1977, and 4,137,451 issued Jan. 30, 1979, both assigned to the assignee of this invention, and also in U.S. Pat. No. 3,846,788 issued Nov. 5, 1974. One form of the present invention is an improvement of the optical encoders disclosed in the two aforementioned U.S. Pat. Nos. 4,037,219 and 4,137,451. The optical encoders described in the aforementioned patents are included in meter registers for encoding the meter reading indications of at least five dial pointer shafts. Encoding illuminations are provided around each of the dial shafts in a closely spaced and compact arrangement due to the closely spaced relationship of a photosensitive sensor array and compact assembly of shafts and other parts of a dial register mechanism. In the first two of the above noted patents, a light distribution system has a light guide plate for producing the encoding illuminations from patterns of reflecting conical recesses. A single incandescent lamp light source, requiring one hundred milliamperes at twelve volts (one and two-tenths watt) in one embodiment, produces input incident radiations that are widely dispersed to be collected by an optical input of the light guide plate formed by one narrow plate edge. The light conducted by the light guide plate is required to be essentially perfectly diffused therein which is sometimes difficult to provide even with larger-power lamp sources. The conical output reflectors are intended to reflect diffused radiations conducted therein, however, the lack of complete diffusion produces uneven output beams. Thus, the output beams are not highly directional nor collimated which reduces their efficiency in illuminating the sensors at required radiation levels to effect a desired response uniformly at each sensor. The total emissions of lamp source are somewhat inefficiently collected and then not precisely distributed relative to the number and levels of effective output beam radiations required. The latter U.S. Pat. No. 3,846,788 discloses a flat electroluminescent panel covered by a light mask substantially covering the panel except for slots or holes therein defining individual light spots or small light exiting sources for furnishing the encoding illuminations to an array of photosensitive sensors.

It is generally desired to eliminate the use of a relatively large and higher power light source for the encoder light distribution systems as described above having an incandescent lamp source. It is also desired to eliminate the heating effects of incandescent lamp source, and reduce the large amount extraneous light emissions in the encoders due to the wide dispersion of the lamp emissions. Also, it is desired to avoid a separate large power supply required for supplying an incandescent lamp source and to avoid loss of operation due to lamp filament failures by replacing the lamp sources with alternative smaller and lower power light sources such as provided by some solid state light emitting sources including the semiconductor light emitting diode (LED) type. Accordingly, to utilize the alternative light sources, the efficiencies of the prior light distribution systems must be substantially improved.

Accordingly, it is a general requirement of the present invention to provide general improvements in a light distribution system for optical encoders including a light guide plate that is adapted to utilize low power light sources for more efficiently producing a large number of encoding illuminations to a photosensitive sensor array. To provide improved efficiency in the light guide plate, output beams forming the encoding illuminations must each produce a predetermined radiation level in an optically isolated and highly directional beam configuration effective to optically activate each sensor at a desired level of sensor response. The amount and mode of conducting internal radiation beams within the light guide plate must be carefully controlled and maintained to be made substantially wholly available to be intercepted at output couplers to produce precisely defined output beams each having the predetermined level of radiation therein. Also, the light input coupler to the light guide plate must collect a maximum amount of incident input radiations from the available light emitted from the low power light source. The collected incident radiations must be applied to the light guide plate for conducting the internal radiation beams therein for maximum use at the output couplers.

With the foregoing requirements and desired improvements in mind for a more efficient light distribution system for producing encoding illuminations in an optical encoder, the present invention is made as briefly summarized hereinafter.

SUMMARY OF THE INVENTION

In accordance with the present invention, an optical encoder has an array of photosensitive sensors and an improved light distribution system for providing a source of encoding illuminations for optically activating the sensors. The improved system includes a transparent light guide plate, an efficient input coupler and discrete output couplers. The input coupler receives and collects input incident radiations from light sources such as provided by semiconductor light emitters. The input coupler has an extended incident radiation distributing area formed in the light guide plate for uniformly spreading the incident radiations into a predetermined distributed beam to be conducted by the light guide plate. The distributed beam is substantially wholly utilized in the light guide plate by being divided into distinct beam segments. Each of the beam segments is directed from the input coupler along fixed predetermined radiation paths and is propagated substantially parallel to opposite flat surfaces of the light guide plate. A pattern of the discrete light output couplers is precisely formed in the light guide plate by output reflecting surfaces each having an optimum area and critical optical alignment with respect to its radiation path and corresponding beam segment. The beam segments are intercepted by the associated output couplers and reflected out in highly directional and collimated output beams. Each of the output beams forms a substantially uniform encoding illumination having a predetermined radiation level for providing the desired response at each of the photosensitive sensors.

Accordingly, it is a general feature of the present invention to provide an optical encoder with an improved light distribution system including a light guide plate for exiting a large number of individually controlled output beams forming uniform encoding illuminations for a photosensitive sensor array when receiving input incident radiations from a light source having a low radiant power output. In accordance with the general feature, an input coupler efficiently collects the incident radiations at one of the front and back surfaces of the light guide plate in a closely coupled and low radiation loss arrangement with the light source. The input coupler includes a cylindrical cross-sectional area of the plate defining an incident radiation distributing area and an extended reflecting surface symmetrically disposed within the distributing area, in one preferred embodiment. A beam of incident radiations may be collected when it is emitted in a wide solid angle at the receiving surface of the plate and is redirected by the reflecting surface into rays propagated radially into cylindrical distributing area and substantially parallel to the flat front and back surfaces of the light guide plate. The input coupler is further effective to direct coadjacent beam segments of the distributed beam in close parallel alignment with predetermined radiation paths defined for the radiations conducted by the light guide plate.

A still further feature of the present invention is to arrange a large predetermined number of discrete light output couplers forming a terminus at each of the predetermined radiation paths in the light guide plate. The output couplers include output reflecting surfaces recessed, at an angle of approximately forty-five degrees in one preferred form, in a common surface of the light guide plate. The output reflecting surfaces are each optically oriented to selectively intercept the beam segment associated with its radiation path with maximum output reflecting efficiency. The beam segments are conducted along either direct radiation paths to each output coupler or along indirect radiation paths via a minimum of intermediate reflectors critically positioned between the input coupler and preselected output couplers. A still further feature of the present invention is to produce highly directional and collimated output beams having predetermined radiation levels from the reflecting surfaces of the output couplers with the output couplers being in optical alignment with the array photosensitive sensors to substantially uniformly radiantly activate the sensors. A still further feature is to provide the output reflecting surfaces of the output couplers with different surface areas which are commonly and cooperatively arranged with respect to other output reflecting surface areas, to the lengths and directions of the beam segments to be intercepted, to the illuminating paths of the output beams, and to a predetermined uniform radiation level and light energy quantity to be separately transmitted by each output beam to an array sensor. A still further feature of the invention is to provide an input coupler arrangement for collecting substantial portions of the total emissions of a light source and to provide alternative input coupler embodiments for accommodating different light beam characteristics and configurations emitted by light sources such as can be produced from semiconductor light emitting devices having different beam orientations and positions relative to the light guide plate.

The aforementioned features and advantages and still further features and advantages of the present invention will be apparent from the detailed description of the preferred embodiments shown in the drawings which are briefly described hereinafter.

BRIEF DESCRIPTION OF THE DRAWINGS

FIG. 2 is a top exploded illustration of FIG. 1 with parts removed;

FIG. 3 is a separate front elevational view of the light guide plate included in the encoder shown in FIGS. 1 and 2;

FIG. 4 is another front elevational view of the light guide plate corresponding to FIG. 3 for purposes of illustrating the various radiation paths provided therein;

FIG. 9 is a fragmentary view in section of another alternative embodiment of the light guide shown in FIGS. 3 and 4 illustrating an alternative light output coupler; and FIG. 10 is a fragmentary view of still another alternative embodiment of the light guide shown in FIGS. 3 and 4 illustrating alternative intermediate reflecting surfaces.

DESCRIPTION OF THE PREFERRED EMBODIMENTS

Figure 1:
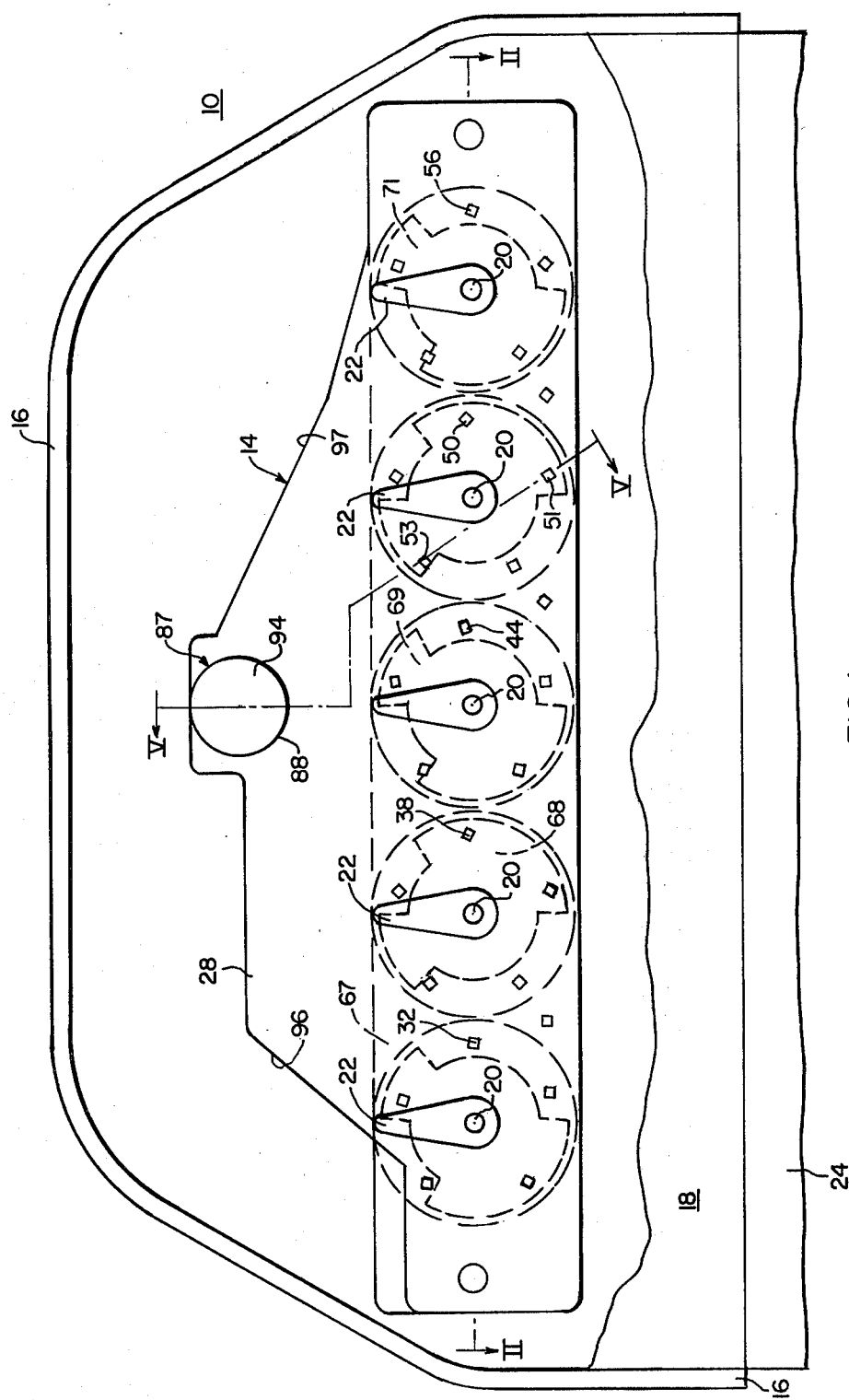
FIG. 1 is a front elevational view with parts removed of an optical encoder for meter dial registers including an improved light distribution system made in accordance with the present invention.

Referring now to the drawings and more particularly to FIGS. 1 and 2, an optical encoder 10 is shown for encoding dial readings of an electric utility meter dial register made in accordance with the present invention. The optical encoder 10 is an improvement of the aforementioned U.S. Pat. Nos. 4,037,219 and 4,137,451, both assigned to the assignee of this invention, and includes generally corresponding principal parts thereof except as replaced by the present invention. The general organization of the optical encoder 10 is described hereinafter for understanding an improved light distribution system 14, made in accordance with the present invention.

The optical encoder 10 for meter dial registers includes a frame 16, shown in FIG. 1, carrying the principal parts of the encoder as more clearly shown in FIG. 2. A register dial plate 18 is mounted at the front of the optical encoder 10 and has the forward ends of five decade related pointer shafts 20 extending therethrough to carry associated dial pointers 22. The optical encoder 10, having the improved light distribution system 14, monitors and produces encoded states responsive to the angular positions of the shafts 20 corresponding to the meter reading indications of the pointers 22 as described in particular detail in the aforementioned two patents.

A printed circuit board 24, also shown in FIG. 2, carries an array of twenty-eight photosensitive sensors 26 of the photoconductive type in one preferred embodiment. The sensors 26 are disposed in a pattern including circular groups of five sensors with each group being associated with a separate one of the shafts 20 substantially as described in the aforementioned U.S. Pat. Nos. 4,037,219 and 4,137,451. Three reference photosensitive sensors are also included in the sensor array at the bottom thereof on the printed circuit board 24.

As described in particular detail hereinbelow, the light distribution system 14 forms a source of encoding illuminations provided by twenty-eight output radiation beams 30 partially shown in FIG. 2 exited by the light guide plate to be directed to the sensors 26. A pattern of discrete light output couplers are each formed in the light guide plate 28 as described below and are partially indicated by the corresponding reference numerals in FIG. 1 as they produce an associated one of the output beams 30. The output couplers are identified in FIGS. 3 and 4 as follows: light output couplers 32, 33, 34, 35 and 36 circumscribe a highest order shaft receiving hole 37; the light output couplers 38, 39, 40, 41 and 42 circumscribe the next to the highest order shaft hole 43; the light output couplers 44, 45, 46, 47 and 48 circumscribe the shaft hole 49; the light output couplers 50, 51, 52, 53 and 54 circumscribe the shaft hole 55; and further light output couplers 56, 57, 58, 59 and 60 circumscribe the lowest order shaft hole 61. In addition to the five circular groups of output couplers identified above, three light output couplers 62, 63 and 64 are formed at the bottom of the light guide plate 28 for producing illuminations to the above-mentioned reference photosensitive sensors of the array on the circuit board 24.

Referring further to the general description of the encoder 10 shown in FIGS. 1 and 2, there are shown five shaft angle code patterns formed on the code discs 67, 68, 69, 70, and 71 separately carried on the shafts 20 and interposed between the light distribution system 14 and the array pattern of photosensitive sensors 26. Opaque and transparent code segments are formed by longer and shorter radial portions of the code discs 67 through 71 so that circularly arcuate transparent segments are defined by open spaces between the ends of the arcuate opaque segments of the code patterns. The code segments are formed in a single rotational track in a single circular plane for light transmission and blocking alignments with the aforementioned light output couplers and associated ones of the sensors 26 so that the encoding illuminations produce the intended encoded states at the sensors when they are activated in response to predetermined radiation levels as dscribed in the aforementioned patents also assigned to the assignee of this invention. In FIG. 2, the output couplers 32, 38, 44, 50 and 56 of the light guide plate 28 are shown as they produce the output beams 30 forming encoding illuminations to optically activate individual ones of the sensors 26. For example, transparent code segments of the alternate code discs 67, 69 and 71 transmit the output radiation beams 30 from the output couplers 32, 44 and 56 to substantially equally illuminate and activate the sensors 26 optically aligned therewith. Thus, a pattern of encoding illuminations is produced by the light distribution system 14 and in a manner described in particular detail hereinafter in accordance with this invention.

Having described the encoder 10 generally hereinabove, the light distribution system 14 is described and more particularly the light guide plate 28 is described as shown in FIG. 3. The material forming the transparent light guide plate 28 is of a known transparent light guide material. Such light guide materials have suitable transparency characteristics which are included in optical glass, acrylic resins, and in one preferred embodiment a molded polycarbonate material is used. The polycarbonate material has an index of refraction in the order of 1.5 for the radiations of interest herein. As understood by those skilled in the art, the index of refraction of the light guide plate 28 is greater than one because that is the index of refraction of air. In accordance with the so-called Snell's law, a light ray in one medium, for example the light guide plate 28, striking a boundary with a second medium, for example air, will be partly refracted into the second medium and the rest will be reflected in the first medium or will be totally reflected back into the first medium depending upon whether the angle of incidence, taken with respect to the normal to the boundary, is less than or greater than, respectively, a so-called critical angle. The critical angle is determined with respect to the ratio of the indices of refractions. In the material of the light guide plate 28, it is believed that the critical angle value is in the order of thirty-nine degrees for polycarbonate while it is forty-two degrees for acrylic. Thus, boundaries between the light guide plate 28 and air, such as formed at the peripheral edges and recessed surfaces thereof, define optical interfaces capable of forming total internal specular reflecting surfaces. Thus, light rays being propagated in the light guide plate 28 and striking an optical interface and reflecting surface, as described below, at an angle of incidence greater than the critical angle will be totally reflected at the interface surfaces at a reflected angle substantially equal to the angle of incidence.

Figure 5:
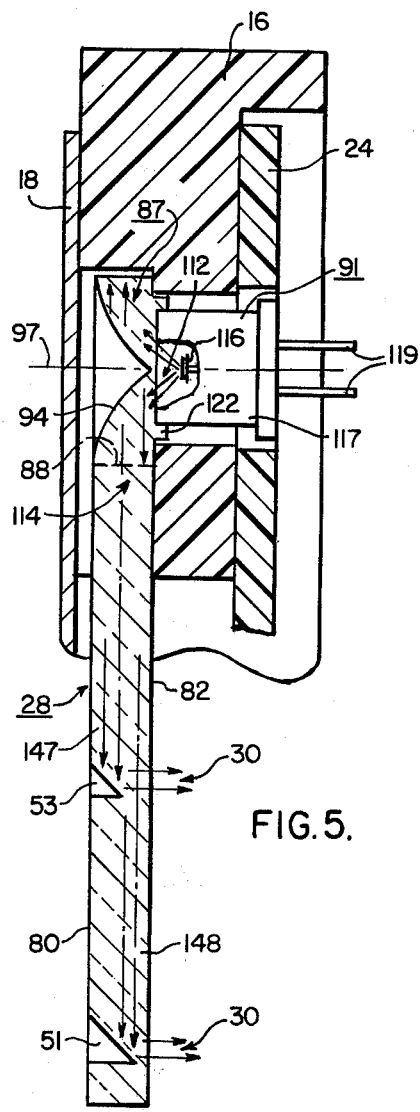
FIG. 5 is a sectional view with parts removed of FIG. 1 taken along the axis V—V thereof and looking in the direction of the arrows and wherein a side view of a light input coupler is included.

Having described the optical characteristics of the material of the light guide plate 28, the overall configuration thereof as shown in FIGS. 3, 4 and 5 is now described. The light guide plate 28 is molded so as to have flat opposite and parallel front and back surfaces 80 and 82, indicated in the cross-sectional view of FIG. 5. In the front views shown in FIGS. 3 and 4, the front surface 80 is in the plane of the drawing. The thickness of the light guide plate 28 is in the order of 0.090 inch (0.23 cm) and the thickness is made to generally correspond to the maximum exiting beam size of the output beams 30. The centers of the shaft receiving holes 37, 43, 49, 55 and 61 are equally spaced and are in the order of 0.62 inch (1.6 cm). The elongated horizontal length of the transparent plate 28 includes a horizontal axis 84 shown in FIG. 3 extending through the centers of the above-noted shaft receiving holes, and, therefore, the five groups of discrete light output couplers as noted hereinabove. A center vertical axis 86 of the light guide plate 28 substantially equally divides the centers of the pattern of light output couplers and generally divides the plate 28.

The outer periphery of the light guide plate 28, shown in FIGS. 3 and 4, is made so that the light guide plate 28 has a compact and functional outline configuration for symmetrically carrying the pattern of light output couplers with respect to an input coupler 87 generally including an integral incident radiation distributing area 88 defined by cylindrical cross-sectional area of the plate 28 extending through the front and back surfaces 80 and 82. Accordingly, the generally lower half of the light guide plate 28 shown in FIG. 3 is intended to carry the pattern of the discrete light output couplers with respect to the associated shaft receiving holes and the generally upper half of the light guide plate 28 is intended to include the input coupler 87 and a confined light conducting area between it and the output couplers, as described further below. The input coupler 87 is, in general, placed to provide the shortest optimum distances between the input coupler distributing area 88 and each of the separate light output couplers. The diverging top edges 98 and 99 of the light guide plate 28 extend downwardly and outwardly relative to the input coupler 87 and form intermediate reflecting surfaces. The edges 98 and 99 are oriented at predetermined angles for redirecting predetermined bent and indirect rather than straight-line radiation paths to separate output couplers, as described below, from the input coupler 87. A further intermediate reflecting surface is formed by the edge 101 recessed into the bottom edge 102 of the light guide plate 28 wherein the edge 101 is formed at the closed end of a notch cutout 103 extending into the bottom edge 102. Within the light guide plate 28, another intermediate reflecting surface 104 is provided at the top of the shaft receiving hole 37. Alternative intermediate reflecting surfaces are illustrated in FIG. 9 described further hereinbelow.

Figure 6:
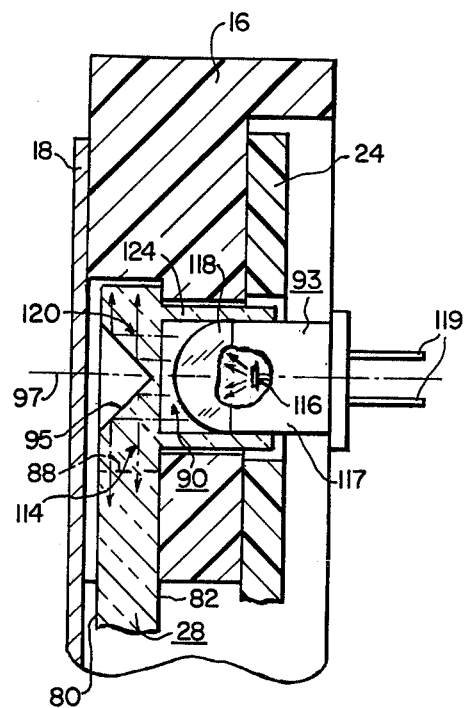
FIG. 6 is a fragmentary cross-sectional view corresponding to FIG. 5 illustrating an alternative input coupler intended to replace the input coupler shown in FIG. 5.
Figure 7:
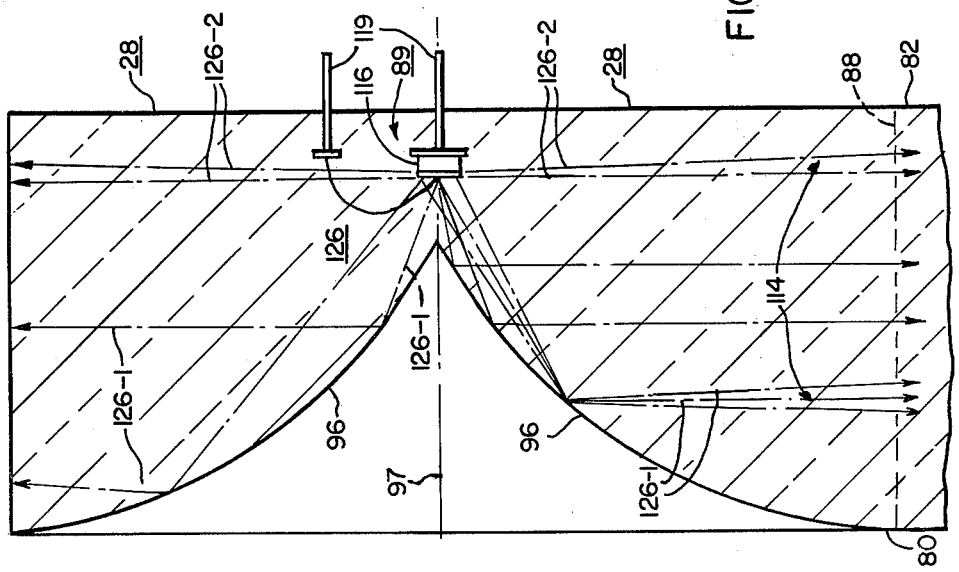
FIG. 7 is a fragmentary cross-sectional view corresponding to FIG. 5 illustrating another alternative input coupler intended to replace the input coupler shown in FIG. 5.

The input coupler 87 and incident radiation distributing area 88 briefly noted above are now described with reference to FIGS. 3 and 5. The input coupler 87 is to collect incident input radiations and redirect them into the light guide plate 28 with optimized efficiency to transfer the maximum of input light energy available to produce the desired light energy levels in the encoding illuminations. The input coupler 87 has a preferred form as shown in FIG. 5 and alternative light input couplers are designated by the reference numerals 89 and 90 in FIGS. 6 and 7, respectively. In general, the input coupler 87 includes a relatively low power light source 91 shown in FIG. 5, and a means for mounting the light source 91 to the plate 28 adjacent the integral incident radiation distributing area 88 and a distributing reflector 94 as shown. In FIGS. 7 and 6 the light sources 92 and 93 and the reflectors 96 and 95 are included in the distributing areas 88b and 88a of alternative input couplers 89 and 90, respectively, as shown therein. Before describing the input coupler further, it is noted that each of the light sources 91, 92 and 93 include either modified or commercially available forms of a semiconductor light emitting diode (LED) device type ESBR5501 having the commercially available form as shown for source 93 in FIG. 6. A semiconductor wafer 116 is mounted inside a housing 117 of the LED light source 93 carrying a lens 118 and pair lead wire conductors 119 connected to the wafer 116. The wafer 116 is typically energized by 1.6 volts at ten ma. (0.016 watt) to produce the incident input radiations to the light guide plate 28.

Referring now to the distributing reflector 94 of the light input coupler 87, it is provided at the incident radiation distributing area 88 defined by the cylindrical cross-sectional area about the axis 97. The distributing reflector 94 is formed by an internal parabolic type reflecting surface recessed into the front surface 80, in the preferred embodiment shown, of the light guide plate 28 so as to have an extended and circularly disposed surface terminating outwardly at the distributing area 88 in FIG. 3. The cross-sectional view of FIG. 5 shows the reflector 94 extending radially inward from the outer periphery at the distributing area 88 to the axis 97 along a parabolic type reflecting surface. The axis 97 extends through the center of the circularly disposed reflecting surface of the reflector 94 normal to the sides 80 and 82 of the light guide plate 28. The axis 97 provides a common reference for the light input coupler 87 for orienting the input incident radiations to be received from the light source 91 and orienting the radiations entering into the plate 28 at the distributing area 88 for further propagation in the plate.

The parabolic configuration of the reflecting surface of the reflector 94 is geometrically defined by first taking a segment of a parabolic having its focus at the position of wafer 116 in FIG. 5 and its latus-rectum oriented perpendicular to the plate surfaces 80 and 82. The parabola defining the segment has a parabola axis, not shown, extending perpendicular to the axis 97 at the parabola focus. A surface of revolution is then generated by rotating the parabola segment about the axis 97 which coincides with the latus-rectrum to define the parabolic reflecting surface of the reflector 94. The cross-sectional view of the reflector 94 shown in FIG. 5 defines two diametrically disposed parabola segments in the plane of the drawing as they form the contour of the reflector 94 and extend radially outward from an apex on the axis 97 immediately inwardly adjacent the back surface 82 to the circular base thereof at the front surface 80. A close approximation to ideal parabolic reflector charcteristics is provided at the reflecting surface of the distributing reflector 94 if the wafer 116 is taken as emitting a beam of radiations from a single point at the reflector's focal point in a wide solid angle. The light rays of an input beam 112 are shown in FIG. 5 originating at the reflector's focal point from the semiconductor wafer 116 to be reflected from the reflector 94 parallel to the plate surfaces 80 and 82. Thus, rays of a beams 114 are shown in FIG. 5 reflected parallel to the front end back surfaces 80 and 82 and through the distributing area 88 into the light guide plate 28. The beam 114 is also shown in FIG. 4 and is referred to hereinafter as a distributed beam 114 since it is also widely spread out in the light guide plate 28 by the distributing reflector 94.

The light source 92 shown in FIG. 5 is mounted to the plate 28 with the wafer 116 located at the focal point of the distributing reflector 94. The contiguous space between the semiconductor wafer 116 and the back surface 82 of the light guide 28 is filled with an optical material having an index of refraction approximately equal to or the same as the index of refraction of the material of the light guide plate 28. In one preferred form, the light source 92 is a modified form of the aforementioned LED type ESBR5501 commercially available as shown in FIG. 6 having a plastic collimating lens 118. The light source 91 of FIG. 5 is formed by taking the LED light source 93 as shown in FIG. 6 and grinding the lens 118 away so that the semiconductor wafer 116 is positioned at the focal point of the distributing reflector 96 when the end of the ground lens surface is cemented in abutting relationship to the back surface 82 of the light guide plate 28 as shown in FIG. 5. The material of the lens 118 also encases the top and sides of the wafer 116 so that when the LED light source 92 is cemented to the back surface 82, by using a suitable optical adhesive, the beam 112 from the wafer 116 has an optically transparent path to the reflector 94 and does not include any beam changing interface.

As an aid in mounting and aligning the light source 91 shown in FIG. 5, an annular raised lip 122 can be molded integrally on the back surface 82 of the light guide around the center axis 97 of the distributing area 88 of the input coupler 88. Correspondingly, a hollow cylinder support 124 is shown in FIG. 6 integrally molded on the back side 82 for receiving and aligning the light source 93 of the input coupler 90. It is contemplated that the light sources 91 and 93 may be molded integrally to the light guide plate 28 at the positions shown in FIGS. 5 and 6.

It is recognized that the finite flat area, in the order of 0.01 inch (0.25 mm.) on a side, of semiconductor wafer 116 though small compared to an incandescent lamp source is not to be ignored when considering it as a point light source because of its close spacing, in the order of 0.05 inch (0.13 cm), from the apex of the reflecting surface of the reflector 94. A given point on the parabolic reflecting surface will receive rays from several points on the wafer 116 on either side of the focal point on the axis 97 as its distance to the reflecting surface decreases. Thus, slight non-parallel deviations will occur in the rays reflected from the reflector 94 and forming the beam 114 in the light guide plate 28. The rays of the beam 114 are believed to deviate from being in true parallel to the surfaces 80 and 82 by only minimum angles and preferably in the order of plus or minus five degrees to provide maximum light coupling efficiency to the output beams 30 at the output couplers. Modifying the parabolic reflector 94 to provide a farther focal point can reduce the non-parallel reflections described above but will also decrease the intensity of incident radiations of the input beam 112 emitted therefrom so that insufficient light energy will be collected for producing output beams 30 at the desired radiation levels.

Referring now to the arcuately extended and spread out distributed beam 114 illustrated in FIG. 4, the beam 114 is provided from input coupler 87 as described above. The distributed beam 114 is propagated in light guide plate 28 along broken line directional arrows designating predetermined radiation paths of beam segments included in the beam 114 and intercepted by the output couplers. Thus, each predetermined radiation path terminates at a separate light output coupler where a beam segment exits as one of the output beams 30. The uniform and symmetrical optical reflecting surface of the distributing reflector 94 of the input coupler 87 produces the uniformly arcuate beam 114 from the incident radiation distributing area 88 such that circularly adjacent beam segments thereof are radially aligned with the axis 97 as they enter the light guide plate 28 at the beginning of each radiation path. One exemplary beam segment is indicated by the shaded area 65 extending along a predetermined direct radiation path 66 to the output coupler 42.

Not all of radiation path have a reference numeral but selected ones are noted hereinafter. The predetermined radiation paths 128, 129, 130, 131, and 133 from the distributing reflector 94 to the left hand most group of encoding light output couplers 32, 33, 34, 35 and 36 and the radiation path 133 to the reference light output coupler 35 includes bent and indirect radiation paths secondarily reflected by the intermediate reflecting surfaces formed along the common top edge 98 of the light guide plate 28 and the intermediate reflecting surface 104 as shown in FIG. 4. The angle of the edge 98 is formed so that the angle of incidence of the light rays striking the optical reflecting surfaces of the edge 98 are larger than the aforementioned critical angle and the angles between the incident and reflecting rays are more than ninety degrees. Similarly, the bottom recess notch edge 101 secondarily reflects the light rays of the radiation paths 133 to the light output coupler 35.

At the right hand most group of light output couplers, the three bent and indirect radiation paths 136, 137, and 138 are secondarily reflected by the intermediate reflecting surfaces formed along the common top edge 99 of the light guide plate 28. The rays of the beam segments of the radiation paths 136, 137, and 138 are intercepted by the light output couplers 56, 57, and 58, respectively, in the same manner as described above for the secondary reflections produced at the edges 98 and 104. Thus, the remaining radiation paths are shown for the rays of the beam segments extending directly or in straight lines from the incident radiation distributing area 88 including the distributing reflector 94 to the remaining light output couplers.

It is noted that the surface areas of the light output couplers are varied in some instances so that intercepted areas of the beam segments are larger as the distance of the associated radiation path increases from the distributing reflector 94. Since the beam segment intensities decrease with increase distance, the output light radiations levels will tend to be more alike by increasing the output coupler areas. Also, where an output coupler is radially aligned and radially overlapping another output coupler, with respect to the center axis 97 of the distributing area 88 of the input coupler 87, compensating variations are made in the areas of the output couplers. The pairs of output couplers 53 and 51, 44 and 63, and 38 and 39, for example, have a closer output coupler of each pair that is recessed less, in the order of 0.035 inch (0.09 cm.) into the front surface 80 of the light guide 28 so as to be molded more shallow therein as shown in FIG. 5 for the pair of output couplers 51 and 53. In FIG. 5, the partially overlapping light rays 155 and 156 of the beam segments directed along the radiation paths 147 and 148 shown in FIG. 4 and strike the smaller and shallower output coupler 53 and larger and deeper, in the order of 0.085 inch (0.22 cm.), output coupler 51, respectively. The pair of output couplers 38 and 39 shown in FIG. 4 are aligned with the partially overlapping paths 141 and 142, and the pair of output couplers 44 and 63, are aligned with the overlapping radiation paths 144 and 145, respectively. It is further noted that the light output couplers of the light guide are further positioned so that the pointer shafts 20, shown in FIGS. 1 and 2, extending through the shaft holes 37, 43, 49, 55, and 61 shown in FIG. 3, do not block the beam segments to any of the different light output couplers. The construction and the optical alignments of the individual output couplers are described further hereinafter.

Figure 8:
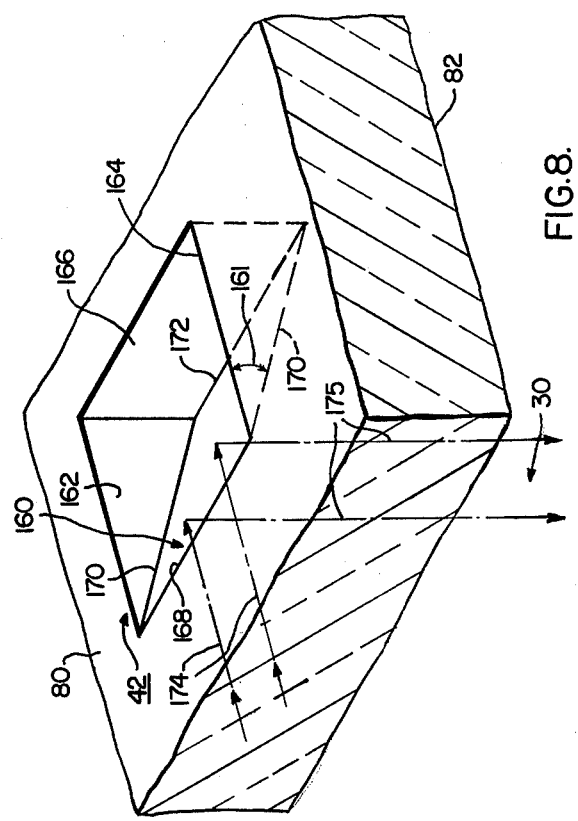
FIG. 8 is a fragmentary perspective view of the light guide plate shown in FIGS. 3 and 4 showing an exemplary one of the light output couplers provided therein.

Referring now to FIG. 8 illustrating the configuration and orientation of an exemplary one of the individual light output couplers such as output coupler 42, the light output couplers are made to produce substantially uniform and equally activating output beams 30 forming the sensor encoding illuminations in a substantially collimated beam fashion as described hereinabove for the output couplers 32, 38, 44, 50 and 56 shown in FIG. 2. Each of the light output couplers includes an output specular reflecting surface 160 extending in a flat plane at an angle 161 of forty-five degrees into the front side 80 of the light guide plate 28 in a recessed manner. The cavity formed by the reflecting surface 160 is somewhat prismatically shaped as shown in FIG. 8. The opposite triangular sides 162 and 164 and the end wall 166, established by the depth of the reflecting surface 160, can be straight or slightly tapered inwardly in a converging fashion for ease of releasing the transparent plate 28 from a mold. The reflecting surface 160 extends from the front edge 168 and into the light guide plate 28 along a pair of straight parallel and sloping side edges 170 to a terminating edge 172 also defining the bottom of the end wall 166. The larger ones of the output couplers have a width in the order of 0.075 inch (0.19 cm.) and extend to the longest depth, noted above for the output coupler 51, which is substantially equal to the thickness of the light guide plate 28. The output beams 30 are substantially symmetrical in height and width with the former being determined by the recessed depth of the surface 160 and the latter determined by the width of the surface extending along edges 168 and 172.

An important feature of the output reflecting surface 160 is that the light rays 174 of the intercepted beam segment 65 are reflected, as indicated by the rays 175, at ninety degrees in the light guide plate 28. The rays 175 are perpendicular to the back surface 82 and exit the plate 28 in a colliminated manner. The forty-five degree angle 161 of the output reflecting surface 160 produces total internal reflections between the rays 174, being received substantially parallel to the front and back plate surfaces 80 and 82, and the rays 175 being reflected out of the plate 28. Since the exiting reflected rays 175 are normal to the back surface 82 there is negligible loss and dispersion of the output beams 30 forming the encoding illumination associated therewith in part due to the proximity of the output couplers to the sensors 26, shown in the exploded view of FIG. 2 but being in the order of 0.135 inch (0.34 cm.) when assembled together. The very small areas of the output reflecting surface 160 of the output couplers causes them to intercept a very narrow beam segments propagated through short radiation path distances to also minimize spreading of the output beams 30.

The efficiency of the light output couplers is also controlled by careful optical alignment of each output reflecting surface 160 shown in FIG. 8 with a single radiation path having a beam segment originating at the distributing reflector 94 and being substantially parallel to the radiation path due to the short radiation paths. Optical alignment of each output reflecting surface 160 of the output couplers is to be understood herein as including the critical alignment of the surface 160 with respect to the predetermined radiation paths of the beam segments of the distributed beam 114 such that for a given area of reflecting surface 160, it will collect the maximum quantity of light energy from a beam segment to reflect the maximum available light energy in the exiting rays 175 effective to optically activate a predetermined one of the sensors 26. Accordingly, the forward edge 168 of each output reflecting surface 160 will be perpendicular to the associated radiation path of the beam segment to be intercepted when viewed from the front of the light guide plate 28 as in FIG. 4.

It is further noted that in positioning the pattern of output couplers, the center of each output reflecting surface 160 is determined by the vertical and horizontal distances from the axes 84 and 86, shown in FIG. 3, on the light guide plate 28. Each of the light output couplers shown to the right and to the left of the axis 86 in FIG. 3 will have the optical alignment axis thereof counterclockwise and clockwise rotated, respectively, from being parallel to be axis 86, at a predetermined alignment angle so that the forward edge 168 of the associated output reflecting surface 160 of each output coupler extends at ninety degrees to the associated radiation path of the beam segment to be intercepted. It is noted by closely observing FIGS. 3 and 4 that in each pattern of five light output couplers around a shaft hole, the right hand most one of each pattern is on the axis 84 and the remaining two pairs of light output couplers are equally distant from the axis 84. Also, common angles of the optical alignment are used for many of the light output couplers so that a minimum of different dimensions and angles are required for locating the large number of output couplers to be optically aligned with one of the sensors 26. Thus, the different beam segments having the different radiation paths shown in FIG. 4 are actually formed by the different areas of the propagated distributed beam 114 which are intercepted at separate beam segments by the different output reflecting surfaces 160 of each light output coupler. It is also noted that the output couplers are spaced and oriented to intercept a maximum of substantially adjacent beam segments of the distributed beam 114 spread out through a circular arc of about one hundred eighty angular degrees so a minimum of the radiations conducted into and by the plate 28 will fail to pass from the distributing reflector 94 and the distributing area 88 without being collected by one of the output couplers and therefore lost.

In review of the light guide system 14 as shown in the FIGS. 3, 4, 5 and 8, it is noted that for a given array of sensors 26 the light energy for desired activation of each sensor 26 is first established in accordance with its optical response characteristics. A corresponding predetermined radiation level is then required for each of the output beams 30 to produce the desired encoding illuminations at the sensors. A maximum symmetrical output beam width is then determined for the output beams 30 to maintain isolation at the sensors and still effect the desired sensor response. A maximum symmetrical beam width in the order of 0.09 inch (0.23 cm.) is used in one embodiment with close spacing being provided between the sensors 26 and the output couplers. The thickness dimension of the light guide plate 28 is then established to be approximately the same as the height in the maximum symmetrical beam size. The number and pattern of the output couplers are then established in accordance with the array pattern and thereafter the area of the light guide plate is made to accommodate this pattern. The light guide plate 28 then must be provided with an area between the input coupler 88 and the output couplers to conduct the total level of radiations sufficient to produce the predetermined radiation levels at all of the output couplers. Since the beam 114 is propagated in separate beam segments over different radiation path distances, the higher intensity segments of shorter paths permit smaller output couplers to intercept narrower beam segments. Thus, higher intensity output beams have less than the maximum beam widths to still radiate an associated sensor with the common predetermined radiation level.

Since the array sensors 26 are close together and have critical radiation response areas, each output beam is precisely oriented to be incident on a sensor 26 and is formed into a collimated beam by the reflecting surface 160. Thus, the rays of the beam segments of the beam 114 must be propagated in the light guide plate substantially parallel to the plate surfaces 80 and 82. Undesired non-parallel rays to the plate surfaces are minimized at each reflecting surface 160 to reduce correspondingly spreading in the output beam exiting therefrom.

Once the quantity of light energy to be conducted by the light guide plate 28 is established, the desired propagated paths thereof to all of the output couplers are defined, and the minimum of ray divergence for propagation essentially parallel to the plate front and back surfaces 80 and 82 is determined so as to maintain the preselected output beam size; the parameters of the input coupler 87 are correspondingly provided. The input coupler 87 must collect the required quantity of light energy from the light emissions available from the semiconductor light emitter of the light source 91 having low radiate power characteristics. The input coupler 87 is provided with the parabolic reflector 94 arranged to collect the incident radiations in a wide solid angle when emitted at a predetermined focal point. The focal point distance is spaced from the reflector 94 to optimally receive the highest incident radiation intensities compatible with redirecting the radiations via parabolic reflections in rays being parallel to the plate surfaces 80 and 82 with minimum divergence. Concurrently, the input coupler 87 concurrently forms a distributed beam 114 having its rays propagated in the above parallel fashion through the distributing area 88. Finally, beam segments of the beam 114 pass from the distributing area 88 so that each is propagated uniformly along its predetermined radiation path to be precisely intercepted at an associated output coupler.

Reference is now made to alternate forms of this invention. The parabolic type reflector 94 shown in FIG. 5 may vary such that surface does not terminate at an apex within the light guide plate 28 but extends from a circular hole at the back surface 82 centered on the axis 97, also forming the axis of revolution, to a larger diameter base at the front surface 80. Since the focal point will remain the same on the axis 97, the light source 91 will be positioned physically further from the back surface 82. The latter arrangement can further compensate for the extended source characteristics of a light source positioned very close to the reflector 94 having a finite extent and producing input incident radiations on either side of the axis 97 and, therefore, the focal point. It has been noted hereinabove that a slightly extended light source produces the largest divergence in the distributed beam 114 at the points of the reflecting surface of the reflector 94 that are closest to the light source. Therefore, the center radiations of the beam emitted from the source 91 will be lost through the center opening of a parabolic reflecting surface having a center hole through the plate 28, but the larger diameter base of the modified reflector will collect more of the outer lower intensity input incident radiations of the wide solid angle beam emitted therefrom and reflect them with only a slight divergence, well within a generally acceptable divergence angle of plus or minus five degrees.

Referring now further to the alternate light input coupler 90 shown in FIG. 6, the aforementioned LED source 93 includes the lens 118 for producing a collimated beam 120 providing input rays of incident radiations substantially parallel to each other and along and radially adjacent the axis 97. The beam 120 is distinguished from the beam 112 of FIG. 5 which is emitted at a large solid angle. The distributing reflector 95 of the distributing area 88a has a reflecting surface formed by a substantially ninety degree cone recessed into the back surface 82 of the light guide plate 28, to be centered with the axis 97 and to have a diameter at the front surface 80 substantially equal to the diameter of the lens 118. Accordingly, the semiconductor wafer 116 is aligned with the center axis 97. The incident radiations of the collimated beam 120 from the light source 93 pass through an air space adjacent the back surface 82 and across the optical boundary provided by the surface of the back surface 92 at an angle of ninety degrees. The conical reflecting surface of the distributing reflector 95 extends with the conical surface disposed at an angle of forty-five degrees to the front and back surfaces 80 and 82. The input incident radiation rays of the beam 120 will be reflected at ninety degrees to the reflector 95 to provide the distributed beam 114 having rays substantially parallel to the front and back surfaces 80 and 82 as shown in FIG. 6. Thus, the beam 114 will be the same as shown in FIG. 4 to be spread out in the thin plane of the light guide plate 28 as well as parallel to the front and back surfaces 80 and 82.

It is noted that the lens 118 of the light source 93 only intercepts a portion of the radiations from the emitting junction of the semiconductor wafer 116 which is located substantially behind the lens 118. The incident radiations received from the wafer 116 are reduced in intensity since they must pass through two aforementioned radiation loss producing optical interfaces and further because the incident radiations of beam 120 originate at the wafer 116 when it is positioned farther away from the reflector 95 in FIG. 6 than the wafer 116 is positioned from the reflector 94 in FIG. 5. In applications where slightly higher power LED sources are permitted, the input coupler 90 may be more suitable since the rays therefrom are received in a parallel fashion. As thus described, the two light input couplers 88 and 90 shown in FIGS. 5 and 6 are operative to receive either the non-collimated beam 112 emitted in a large solid angle from the light source 91 or the collimated beam 120 emitted from the light source 93. Thus, the three dimensional character of incident beams 112 and 120 are converted to an essentially two dimensional or thin distributed beam 114 by the input couplers of this invention.

The further alternative input coupler 89 shown in FIG. 7 utilizes the light source 92 provided by the light emitting semiconductor wafer 116, without the normal housing 117 shown in FIG. 6, and it is molded inside the light guide plate 28 and between the surfaces 80 and 82. The incident radiation distributing area 88b of the coupler 89 includes two such parts, one including the parabolic type of reflecting surface forming the distributing reflector 96 which is formed about the axis 97 as described above for the distributing reflector 94. The apex of the parabolic reflector is positioned about midway between the front and back surfaces 80 and 82. Accordingly, the source 92 is positioned on the axis 97 at the focal point of the reflector 96 and inside the back surface 82. The input incident radiations of the beam 126 are emitted radially outward forwardly and to the sides from the light source 92 and the axis 97 through a solid beam angle up to slightly more than ninety degrees inside the light guide 28. The emitted light defines a beam portion 126-1 collected by the reflector 96 defining one incident radiation distributing area and a further beam portion 126-2 is not incident on the reflector 96 but passes directly through a second incident radiation distributing area part formed by the cylindrical light guide distributing area 88b laterally adjacent the wafer 116. The distributed beam 114 which is utilized by the light guide plate 28 is propagated from the wafer 116 both via the reflector 96 and directly into the cylindrical distributing area 88b to form the distributed beam 114 of FIG. 4. Thus, more of the light emissions originating from the wafer 116 of the light source 92 are trapped in the plate 28 in the coupler 89 than are by the couplers 87 and 90 in FIGS. 5 and 6. The lateral incident radiations of the beam portion 126-2 further compensate for the extended source effect due to the finite extent of the semiconductor wafer 116, which extended source effect becomes greater as it is positioned closer to the parabolic type distributing reflector 96 so that not all of the incident beam portion 126-1 is emitted from a single point of the reflector's its focal point.

A still further light input coupler can be provided by modifying the input coupler 89 shown in FIG. 7 where the incident radiation distributing area about the axis 97 would not include the reflector 96. The light source 92 would have the semiconductor wafer 116 molded midway between the surfaces 80 and 82 of the light guide plate 28. The beam portion 126-1 would be generally normal to the front surface 80 and pass out of the light guide but the flat lateral beam portion 126-2 will provide all of the distributed beam 114. A still further modification of the light input couplers 87 and 89 may be made by approximating the parabolic type reflecting surface of the distributing reflectors 94 and 96 by providing several stepped conical surfaces of about the axis 97 so that approximately the same focal point lays on the axis line 97. The latter modified parabolic reflecting surface may be used where machining techniques for making the parabolic contours are difficult.

Alternative output reflecting surfaces can be provided at the output couplers, as shown in FIG. 9 and alternative intermediate reflecting surfaces can be provided as shown in FIG. 10 to reshape the reflected radiations. The curved reflecting surfaces shown in FIGS. 9 and 10 chiefly converge and increase the intensity of the radiations to be reflected. The alternative output coupler 190 has the aspherical concave output reflecting surface 167. The rays 197 of an incident distributed beam segment from the distributing reflector 94 are reflected at the surface 167 as a more parallel and collimated output beam or as a converging output beam. Thus, the reflecting surface 167 reshapes the rays 194 of an incident beam segment to intensify the output beam formed by reflected rays 196 on a predetermined one of the photosensitive sensors 26, shown in FIG. 2, to which it is directed. Also, the rays 196 forming the output beam may be focused on a point forward of one of the sensors 26 in the plane of the code discs 67 through 71, shown in FIG. 2 to aid in producing a sharper shutter effect when the code discs are rotated between encoding illumination blocking and transmitting positions relative to the output beams as shown for the output beams 30 in FIG. 2.

In FIG. 10 the alternative intermediate reflecting surfaces 202, 203, 204 and 205 having convexly curved configurations and are provided at a modified edge 98' replacing the edge 98 in the light guide plate 28 shown in FIG. 4. Further alternative intermediate reflecting surfaces 206 and 208 have convexly curved configurations that replace the intermediate reflecting surfaces 101 and 104 shown in FIG. 4. The beam segments having the longer and secondary reflections of the radiation paths 128 and 132 are reshaped at the common alternative intermediate reflecting surface 204 to be intensified and made more parallel to the radiation paths 128 and 132 of the associated output couplers 32 and 62, respectively. Similarly, the individual alternative intermediate reflecting surfaces 202, 203, 206 and 208 reshape the distributed beam segments incident thereat to more effectively direct them to the output couplers intended to receive the particular beam segment. The output couplers of FIG. 10 can also have the modified output reflecting surfaces of FIG. 9 to direct the output beams 30 with an improved narrower beam configuration especially where the radiation paths are longest. Further alternative intermediate reflecting surfaces can be provided on the edge 97 in FIG. 4 as described above for the edge 98.

In summary, an improved light distribution system 14 for the optical encoder 10 made in accordance with this invention efficiently couples the radiations emitted by light sources including lower power semiconductor light emitting devices to the light guide plate 28. Input incident radiations forming a substantial part of the source emissions can be collected when emitted in different beam configurations, as described for the light sources 91, 92 and 93, at an associated input coupler for optimum distribution at the distributing area 88 including one of alternative distributing reflectors 94, 96 and 95. The distributing area 88 uniformly spreads out the distributed beam 114 in substantially equal beam segments as it enters the light guide plate 28. The rays being propagated in the distributed beam segments are maintained substantially wholly parallel to the front and back surfaces 80 and 82 of the light guide plate 28 and substantially and effectively parallel to the separate predetermined radiation paths to be precisely and efficiently intercepted at the predetermined pattern of light output couplers. The area sizes and optical alignments of the output reflecting surfaces of each light output coupler are individually determined as described hereinabove to produce the output beams 30. The output beams 30 from the discrete light output couplers are produced substantially uniformly in a controlled fashion, preferably collimated, to be directed as predetermined patterns of encoding illuminations radiating each sensor in the array of photosensitive sensors 26 at a predetermined radiation level. The small cross-sectional area of each output coupler output beam and the small or negligible divergence in the output beam widths maintains optical isolation of the encoding illuminations.

While preferred embodiments of the present invention are disclosed hereinabove, it is apparent to those skilled in the art that various changes and modifications may be made therein with departing from the spirit and scope of our invention.

What we claim is:

1. A light distribution system for an optical encoder having an array of photosensitive sensors, comprising:
   a transparent light guide plate having front and back parallel surfaces;
   a light input coupler including an incident radiation distributing area formed within said light guide plate for receiving a predetermined beam of input incident radiations, said distributing area spreading the input incident radiations into a distributed beam having plural beam segments each being directed in said light guide plate substantially wholly parallel to a single predetermined radiation path and further being substantially parallel to said front and back surfaces; and
   a predetermined pattern of plural discrete light output couplers each formed by an output reflecting surface recessed into one of said front and back surfaces, each of the output reflecting surfaces being in optical alignment with only a single one of said predetermined radiation paths to intercept a separate one of said beam segments, said reflecting surfaces having different surface areas corresponding to the different lengths of the predetermined radiation paths from said distributing area to produce output beams for uniformly illuminating each of said sensors of said array.

2. The light distribution system as claimed in claim 1 wherein said predetermined ones of said light output couplers are spaced closer and farther from said distributing area, and wherein the area of the output reflecting surfaces are smaller to intercept a narrower beam segment when closer to said distributing area and the surfaces are larger for farther ones of said output couplers.

3. The light distribution system as claimed in claim 2 wherein at least two of said predetermined ones of said light output couplers have the output reflecting surfaces thereof intercepting at least two partially overlapping beam segments and further wherein the closer one of said predetermined output couplers has a shorter recessed area and the farther one of said predetermined output couplers has a longer recessed area.

4. The light distribution system as claimed in claim 1 wherein each of said output couplers includes a flat output reflecting surface recessed into said light guide at angle in the order of forty-five degrees.

5. The light distribution system as claimed in claim 1 wherein said incident radiation distributing area includes a circularly extending reflector having a circularly extended parabolic reflecting surface recessed into one of said front and back surfaces and wherein said input coupler includes a light source positioned at the focal point of said parabolic reflecting surface.

6. The light distribution system as claimed in claim 5 wherein said light source is formed by a semiconductor light emitting device with the wafer element thereof positioned at said focal point.

7. The light distribution system as claimed in claim 6 wherein said light emitting device includes an optically transparent material encasing said wafer element and contiguous with one of said front and back surfaces of said light guide plate.

8. The light distribution system as claimed in claim 1 wherein said incident radiation distributing area includes a circularly extending reflector having a ninety degree conical reflecting surface and wherein said input coupler includes a light source for producing said input radiations along the center axis of said conical reflecting surface.

9. The light distribution system as claimed in claim 8 wherein said light source is formed by a semiconductor light emitting device having a collimating lens aligned with said center axis of said conical reflecting surface.

10. The light distribution system as claimed in claim 1 wherein said light guide plate includes predetermined intermediate reflecting surfaces for directing secondary reflections of redirected ones of said beam segments extending between said incident radiation distributing area and further predetermined ones of said light output couplers.

11. The light distribution system as claimed in claim 10 wherein at least one of said intermediate reflecting surfaces is formed along a common edge of said light guide plate.

12. The light distribution system as claimed in claim 11 wherein said intermediate reflecting surfaces are formed along at least two different edges of said light guide plate.

13. The light distribution system as claimed in claim 1 wherein said predetermined patterns of light output couplers are symmetrically disposed along a single straight axis and wherein the adjacently disposed beam segments have a substantial arcuate extent for directing the separate beam segments to each of said light output couplers.

14. The light distribution system as claimed in claim 10 wherein at least one of said intermediate and reflecting surfaces is formed with a concave reflecting surface.

15. The light distribution system as claimed in claim 1 wherein said light input coupler includes a light source mounted within said light guide plate and laterally adjacent said incident radiation distributing area.

16. The light distribution system as claimed in claim 15 wherein said incident radiation distributing area includes a circularly extending reflector having a parabolic reflecting surface.

17. A light distribution system for a meter dial register encoder having an array including groups of circularly disposed photoconductive sensors, wherein said light distribution system comprises:
   a light source;
   a flat transparent light guide plate having opposite front and back parallel surfaces terminated by edge surfaces defining an elongated horizontal configuration;
   a light input coupler for mounting said light source at the light guide plate and said input coupler including an incident radiation distributing area arranged for receiving a predetermined beam of input incident radiations from said light source, said distributing area being formed by a recessed circularly arcuate reflecting surface in said light guide plate effective to produce a flat distributed beam uniformly spread out along individual radially extending beam segments extending substantially parallel to the opposite light guide plate surfaces;
   a pattern of light output couplers symmetrically disposed with respect to said input coupler and optically aligned with said array of sensors, each of said light output couplers including an output reflecting surface extending at substantially the same angle into a common one of said opposite surfaces of said light guide plate so as to have a predetermined optical alignment for intercepting separate ones of said beam segments and for reflecting individual output beams in a substantially collimated manner to uniformly illuminate said array including groups of circularly disposed photoconductive sensors.

18. The light distribution system as claimed in claim 17 wherein said light guide plate further includes plural intermediate reflectors each positioned for redirecting predetermined ones of said beam segments from said light input coupler and to predetermined ones of said light output couplers so that the predetermined ones of said beam segments are directed in a bent and indirect manner to the predetermined ones of said light output couplers.

19. The light distribution system as claimed in claim 18 wherein said pattern of light output couplers includes plural groups of circularly disposed input couplers substantially evenly positioned on either side of a center vertical reference axis of said light guide plate extending through the center of said input coupler so that substantially equal numbers of the beam segments are spread out from said distributing area on either side of said vertical reference axis.

20. The light distribution system as claimed in claim 19 wherein said light guide plate includes a plurality of hole openings for receiving dial pointer shafts associated with each of separate register dials to be encoded and wherein each group in said pattern of light output couplers circumscribes each of said hole openings.

21. The light distribution system as claimed in claim 20 wherein said plural intermediate reflectors are formed by at least two peripheral edges of said light guide plate and wherein a further one of said plural intermediate reflectors is formed by an edge partially forming one of said hole openings in said light guide plate.

22. The light distribution system as claimed in claim 17 wherein said reflecting surface of said distributing area is formed with a parabolic reflecting surface configuration and wherein said light source is positioned at the focal point of the parabolic reflecting surface configuration.

23. The light distribution system as claimed in claim 17 wherein said reflecting surface of said distributing area has a recessed conical configuration.

24. The light distribution system as claimed in claim 17 wherein said output reflecting surface of each of said output couplers extends at an angle of forty-five degrees along a flat output reflecting surface.

25. The light distribution system as claimed in claim 24 wherein each flat output reflecting surface has a larger area when included in an output coupler farther from said light input coupler.

26. The light distribution system as claimed in claim 17 wherein each of the output reflecting surfaces is convave.

27. The light distribution system as claimed in claim 17 wherein said light source is integrally molded within said light guide plate.

28. The light distribution system as claimed in claim 27 wherein said reflecting surface of said distributing area has a parabolic surface configuration with said light source being integrally molded at the focal point of said parabolic surface configuration.

29. A light distribution system for an optical encoder having an array of photosensitive sensors, comprising:
   a transparent light guide plate having front and back parallel surfaces;
   a light input coupler including an incident radiation distributing area including a parabolic reflecting surface recessed into one of said parallel surfaces so as to be defined by a surface of revolution generated by revolving a segment of a parabola about an axis extending through the center of said distributing area and perpendicular to the parallel plate surfaces for receiving a predetermined beam of input incident radiations, said reflecting surface of said distributing area reflectively spreading the input incident radiations into a circularly arcuate distributed beam having plural beam segments, each of the beam segments being propagated in said light guide plate radially of said axis substantially parallel to a single predetermined radial radiation path and being further propagated substantially parallel to said front and back surfaces; and
   a predetermined pattern of plural discrete light output couplers each formed by an output reflecting surface recessed into one of said front and back surfaces, each of the output reflecting surfaces being in optical alignment with only one of said predetermined radial radiation paths to intercept a separate one of said beam segments, and each of said reflecting surfaces producing an output beam for uniformly illuminating each of said sensors of said array.

* * * * *